United States Patent
Wang et al.

(10) Patent No.: US 11,579,229 B2
(45) Date of Patent: Feb. 14, 2023

(54) IMAGING METHOD AND DEVICE FOR NONLINEAR PARALLEL MAGNETIC RESONANCE IMAGE RECONSTRUCTION, AND MEDIUM

(71) Applicant: SHENZHEN INSTITUTES OF ADVANCED TECHNOLOGY, Guangdong (CN)

(72) Inventors: Haifeng Wang, Guangdong (CN); Dong Liang, Guangdong (CN); Sen Jia, Guangdong (CN); Xin Liu, Guangdong (CN); Hairong Zheng, Guangdong (CN)

(73) Assignee: SHENZHEN INSTITUTES OF ADVANCED TECHNOLOGY, Guangdong (CN)

( * ) Notice: Subject to any disclaimer, the term of this patent is extended or adjusted under 35 U.S.C. 154(b) by 66 days.

(21) Appl. No.: 16/473,806

(22) PCT Filed: Jul. 24, 2018

(86) PCT No.: PCT/CN2018/096782
§ 371 (c)(1),
(2) Date: Jun. 26, 2019

(87) PCT Pub. No.: WO2019/153659
PCT Pub. Date: Aug. 15, 2019

(65) Prior Publication Data
US 2021/0356545 A1  Nov. 18, 2021

(30) Foreign Application Priority Data

Feb. 9, 2018 (CN) .......................... 201810132444.9

(51) Int. Cl.
*G01V 3/00* (2006.01)
*G01R 33/561* (2006.01)
(Continued)

(52) U.S. Cl.
CPC ...... *G01R 33/5611* (2013.01); *G01R 33/5608* (2013.01); *G01R 33/58* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2006/0184000 A1  8/2006  Wang et al.
2006/0208731 A1  9/2006  Wang et al.
(Continued)

FOREIGN PATENT DOCUMENTS

| CN | 1799498 A | 7/2006 |
| CN | 1827039 A | 9/2006 |
| CN | 104749538 A | 7/2015 |

OTHER PUBLICATIONS

CN 102519597 A (Year: 2012).*
(Continued)

*Primary Examiner* — Walter L Lindsay, Jr.
*Assistant Examiner* — Frederick Wenderoth
(74) *Attorney, Agent, or Firm* — Ohlandt, Greeley, Ruggiero and Perle, LLP (57) ABSTRACT

There are provided a parallel rapid imaging method and device based on a complex number conjugate symmetry of multi-channel coil data and nonlinear GRAPPA image reconstruction, and a medium. The imaging method includes: obtaining virtual conjugate coil data by expanding the actual multi-channel coil data; combining actual multi-channel coil data and virtual multi-channel coil data to obtain a linear data term and a nonlinear data term; calibrating weighting factors of the linear data term and the nonlinear data term by using combined low-frequency full-sampling data (margins of the low-frequency full-sampling data includes parts of high-frequency data); reconstructing data which is under-sampled in a high-frequency region
(Continued)

according to the calibrated weighting factors; fusing the low-frequency full-sampling data and the reconstructed data for the high-frequency region.

16 Claims, 4 Drawing Sheets

(51) Int. Cl.
   *G01R 33/56* (2006.01)
   *G01R 33/58* (2006.01)
(58) Field of Classification Search
   USPC .......................................................... 324/309
   See application file for complete search history.

(56) References Cited

U.S. PATENT DOCUMENTS

2010/0244825 A1\* 9/2010 Brau ................... G01R 33/5611
                                                      324/309
2014/0340083 A1   11/2014 Zhang et al.

OTHER PUBLICATIONS

CN 107507148 A (Year: 2017).\*
CN 1827039 A (Year: 2006).\*
International Search Report dated Nov. 16, 2018 for PCT application No. PCT/CN2018/096782.
Wang et al; "Nonlinear GRAPPA Reconstruction with Virtua Coil Conception"; National Natural Science Foundation of China and the Science and Technology Program of Guangdong; 2018; pp. 1-6.
Blaimer et al; "Virtual Coil Concept for Improved Parallel MRI Employing Conjugate Symmetric Signals"; Magentic Resonance in Medicine; Mar. 13, 2008; pp. 1-10.
Jia et al; "Nonlinear SPIRiT using a second order virtual coil for imporved parallel imaging reconstruction"; National Natural Science Foundation of China and the Science and Technology Program of Guangdong; 2017; pp. 1-3.
Chang et al.; "Nonlinear GRAPPA: A Kemal Approach to Paralle MOcRI Reconstruction"; Oct. 10, 2011; pp. 1-11.
European Search Report dated Oct. 18, 2021 for European Appl. No. 18882276.1.

\* cited by examiner

IMAGING METHOD AND DEVICE FOR NONLINEAR PARALLEL MAGNETIC RESONANCE IMAGE RECONSTRUCTION, AND MEDIUM

CROSS-REFERENCED APPLICATIONS

This application is a national phase application of PCT international patent application PCT/CN2018/096782, filed on Jul. 24, 2018 which claims priority to Chinese Patent Application No. 201810132444.9, filed with the Chinese Patent Office on Feb. 9, 2018, both of which are incorporated herein by reference in their entireties.

BACKGROUND

1. Field of the Disclosure

The present disclosure relates to the field of magnetic resonance image reconstruction, and in particular to an imaging method for nonlinear parallel magnetic resonance image reconstruction, a device for magnetic resonance image reconstruction and a medium.

2. Discussion of the Background Art

Image reconstruction is an important step in parallel magnetic resonance imaging. In actual clinical studies, high-performance image reconstruction method plays a critical role in parallel rapid imaging. Currently, there are multiple image reconstruction methods in multi-channel coil parallel imaging, such as SENSE (Sensitivity encoded) method, GRAPPA (Generalized auto calibrating partially parallel acquisitions) method and SMASH (Simultaneous acquisition of spatial harmonics) method. The GRAPPA method has a wide applicable range because the GRAPPA method does not require a linear method of calculating sensitivities of coils for multiple channels.

Among multiple methods based on the GRAPPA method, a Nonlinear GRAPPA reconstruction method is limited by the number of channels of magnetic resonance data, thus quality of a reconstructed image is poor. A GRAPPA reconstruction method based on Virtual Coil Conception (VCC) has a poor performance on the aspect of reducing artifacts and noise.

SUMMARY

In view of the above technical problems, an imaging method is provided in the present disclosure, to improve the quality of a reconstructed image and reduce artifacts and noise of the reconstructed image.

To address the above technical problems, there are disclosed an imaging method for nonlinear parallel magnetic resonance image reconstruction, a device for magnetic resonance image reconstruction and a medium in the present disclosure. Technical solutions of the present disclosure are as follows.

An imaging method for nonlinear parallel magnetic resonance image reconstruction includes:

step S1, acquiring, in a parallel manner, actual coil data by using coils for multiple channels and expanding the actual coil data to obtain virtual coil data having the same number of channels as the actual coil data, where the virtual coil data and the actual coil data have a conjugate symmetric relationship;

step S2, combining the actual coil data and the virtual coil data to obtain a data combination term;

step S3, calibrating a weighting factor by using the data combination term and full-sampling data in a low-frequency region of a sampling space;

step S4, reconstructing missing data in the sampling space based on the calibrated weighting factor to obtain reconstructed data, where the missing data indicates data which is not sampled in a high-frequency region of the sampling space;

step S5, fusing the full-sampling data in the low-frequency region of the sampling space and the reconstructed data to obtain complete sampling space data; and step S6, obtaining a final reconstructed image based on the complete sampling space data for multiple channels.

Preferably, step S6 includes: squaring the complete sampling space data for each channel to obtain a square of the complete sampling space data for each channel and summing the squares of the complete sampling space data for the multiple channels to obtain the final reconstructed image; or multiplying the complete sampling space data for the multiple channels by sensitivities of the coils for the multiple channels to obtain products respectively and summing the products to obtain the final reconstructed image.

Preferably, in step S2, the data combination term includes a constant, a linear data term, and a nonlinear data term.

Preferably, step S3 includes: generating a mixed data combination term by using the data combination term and the full-sampling data in the low-frequency region of the sampling space, where the mixed data combination term includes a constant, a linear data term, and a nonlinear data term.

Preferably, the nonlinear data term in the data combination term is a nonlinear data term which is raised to the power of two or more; and/or the nonlinear data term in the mixed data combination term is a nonlinear data term which is raised to the power of two or more.

Preferably, the calibrating in step S3 includes: performing fitting by using a linear regression method to obtain a set of weighting factors and constructing a set of linear combination relationships between data and adjacent data of the data in the sampling space.

Preferably, the calibrating in step S3 is performed by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \tilde{S}_l(k_y + b \cdot R \cdot \Delta k_y, k_x + h \cdot \Delta k_x) + \tilde{w}_{j,r}^{(0)} \times$$

$$1 + \sum_{l=1}^{L} \sum_{b=B_1}^{B_2} \sum_{h=H_1}^{H_2} \tilde{w}_{j,r}^{(2,0)}(l, b, h) \times \tilde{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times \tilde{S}_l(k_y + b \cdot R \cdot \Delta k_y, k_x + h \cdot \Delta k_x) \times$$

$$\tilde{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \tilde{S}_l(k_y + b \cdot R \cdot \Delta k_y, k_x + h \cdot \Delta k_x) \times$$

$$\tilde{S}_l(k_y + b \cdot R \cdot \Delta k_y, k_x + (h+2) \cdot \Delta k_x)$$

where $j = 1, 2, \ldots, 2 \cdot L$, $r \neq b \cdot R$, and

-continued $$\tilde{S}_l(k) = \begin{cases} S_l(k), & l = 1, 2, \ldots \ldots L \\ S_l^*(-k), & l = L+1, L+2, \ldots \ldots 2 \cdot L \end{cases}.$$

A computer readable medium is provided according to the disclosure, the computer readable medium stores a program, the program is executed by a computer to perform the imaging method.

A device for magnetic resonance image reconstruction implementing the imaging method is provided according to the disclosure. The device includes:

an acquiring module configured to acquire, in a parallel manner, actual coil data by using coils for multiple channels and expanding the actual coil data to obtain virtual coil data having the same number of channels as the actual coil data, where the virtual coil data and the actual coil data have a conjugate symmetric relationship;

a data combining module configured to combine the actual coil data and the virtual coil data to obtain a data combination term;

a calibrating module configured to calibrate a weighting factor by using the data combination term and full-sampling data in a low-frequency region of a sampling space;

a reconstructing data module configured to reconstruct missing data in the sampling space based on the calibrated weighting factor to obtain reconstructed data, where the missing data indicates data which is not sampled in a high-frequency region of the sampling space;

a fusing module configured to fuse the full-sampling data in the low-frequency region of the sampling space and the reconstructed data to obtain complete sampling space data; and an imaging module configured to obtain a final reconstructed image based on the complete sampling space data for multiple channels.

Preferably, the imaging module is configured to: square the complete sampling space data for each channel to obtain a square of the complete sampling space data for each channel and summing the squares of the complete sampling space data for the multiple channels to obtain the final reconstructed image; or multiply the complete sampling space data for the multiple channels by sensitivities of the coils for the multiple channels to obtain products respectively and summing the products to obtain the final reconstructed image.

Preferably, the data combination term obtained by the data combining module includes a constant, a linear data term, and a nonlinear data term. The calibrating module is configured to generate a mixed data combination term by using the data combination term and the full-sampling data in the low-frequency region of the sampling space, where the mixed data combination term includes a constant, a linear mixed data term, and a nonlinear data term.

Preferably, the nonlinear data term in the data combination term obtained by the calibrating module is a nonlinear data term which is raised to the power of two or more; and/or the nonlinear data term in the mixed data combination term is a nonlinear data term which is raised to the power of two or more. The calibrating module is configured to perform fitting by using a linear regression method to obtain a set of weighting factors and constructing a set of linear combination relationships between data and adjacent data of the data in the sampling space.

Preferably, the calibrating module is configured to perform the calibrating by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \tilde{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \tilde{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\tilde{S}_l(k_y + b \cdot R \cdot \Delta k_y, k_x + h \cdot \Delta k_x) \times \tilde{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \tilde{S}_l(k_y + b \cdot R \cdot \Delta k_y, k_x + h \cdot \Delta k_x) \times$$

$$\tilde{S}_l(k_y + b \cdot R \cdot \Delta k_y, k_x + (h+2) \cdot \Delta k_x)$$

where $j = 1, 2, \ldots, 2 \cdot L$, $r \neq b \cdot R$, and $$\tilde{S}_l(k) = \begin{cases} S_l(k), & l = 1, 2, \ldots \ldots L \\ S_l^*(-k), & l = L+1, L+2, \ldots \ldots 2 \cdot L \end{cases}.$$

The following two advantageous effects can be achieved by implementing the present disclosure. First, the quality of a reconstructed image obtained by using the parallel magnetic resonance rapid imaging can be improved, and artifacts and noise of the reconstructed image can be reduced. Second, it is unnecessary to acquire extra data and lengthen scanning time while the quality of the reconstructed image is improved.

BRIEF DESCRIPTION OF THE DRAWINGS

For a better understanding of the technical solutions of the present disclosure, reference may be made to the following drawings for illustrating embodiments or the conventional technology. Products or methods involved in some embodiments or the conventional technology are briefly shown in the drawings. Basic information of the drawings is as follows.

DETAILED DESCRIPTION OF EMBODIMENTS

Technical solutions or advantageous effects in embodiments of the present disclosure are further described in detail herein. It is apparent that the embodiments described herein are only parts not all embodiments of the present disclosure.

It should be noted that the present disclosure aims to solve the problems existing in the corresponding conventional technology in the field of magnetic resonance image reconstruction. Therefore, the present disclosure is particularly applicable to the subdivision of magnetic resonance image reconstruction. However, it is not meant that the scope of application of the technical solutions of the present disclosure is limited to magnetic resonance image reconstruction. Those skilled in the art can reasonably implement the present disclosure in various specific applications in the field of magnetic resonance imaging as needed.

Figure 1:
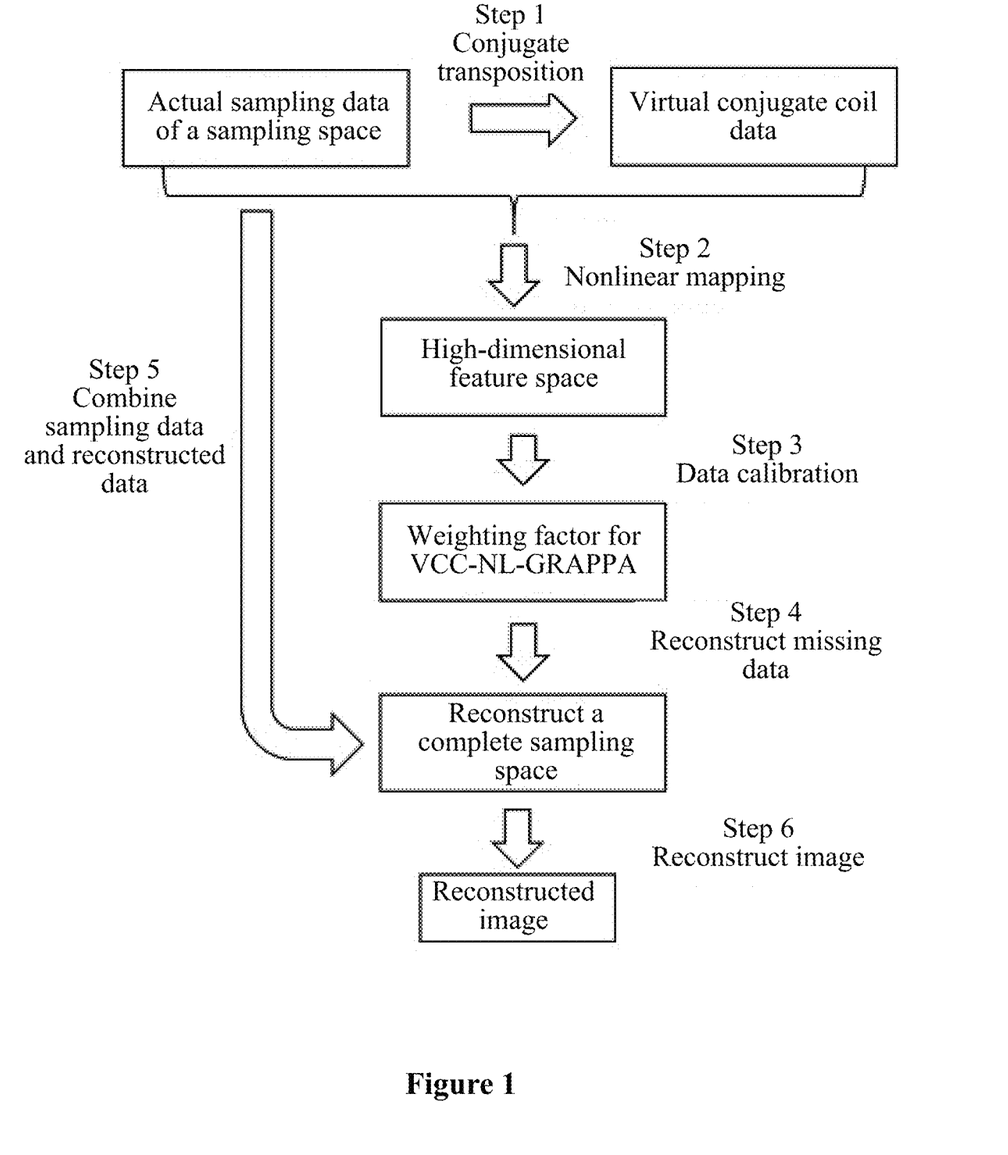
FIG. 1 is a schematic flowchart of a VCC-NL-GRAPPA method.

There is provided an imaging method for nonlinear parallel magnetic resonance image reconstruction. Referring to FIG. 1, the imaging method includes the following steps S1 to S6.

In step S1, actual coil data is acquired in a parallel manner by using coils for multiple channels and the actual coil data is expanded to obtain virtual coil data having the same number of channels as the actual coil data. The virtual coil data and the actual coil data have a conjugate symmetric relationship.

In step S2, the actual coil data and the virtual coil data are combined to obtain a data combination term.

In step S3, a weighting factor is calibrated by using the data combination term and full-sampling data in a low-frequency region of a sampling space.

In step S4, missing data in the sampling space is reconstructed based on the calibrated weighting factor to obtain reconstructed data. The missing data indicates data which is not sampled in a high-frequency region of the sampling space.

In step S5, the full-sampling data in the low-frequency region of the sampling space and the reconstructed data are fused to obtain complete sampling space data.

In step S6, a final reconstructed image is obtained based on the complete sampling space data for multiple channels.

In the imaging method provided in the present disclosure, the number of channels of the magnetic resonance data is expanded by using conjugate symmetry of complex numbers. Specifically, in a case that scanning time is not lengthened and extra data is not acquired, multi-channel complex number data obtained by actually sampling is subjected to a process of conjugate transposition, to obtain virtual data having the same number of channels as the multi-channel complex number data, such that the amount of the known data for a subsequent reconstruction step is doubled, thereby improving signal-to-noise ratio and accuracy of a subsequent reconstruction result. Further, a nonlinear data term is obtained in the process of image reconstruction, thus the quality of a reconstructed image can be full improved and artifacts and noise of the reconstructed image can be reduced.

Figure 2:
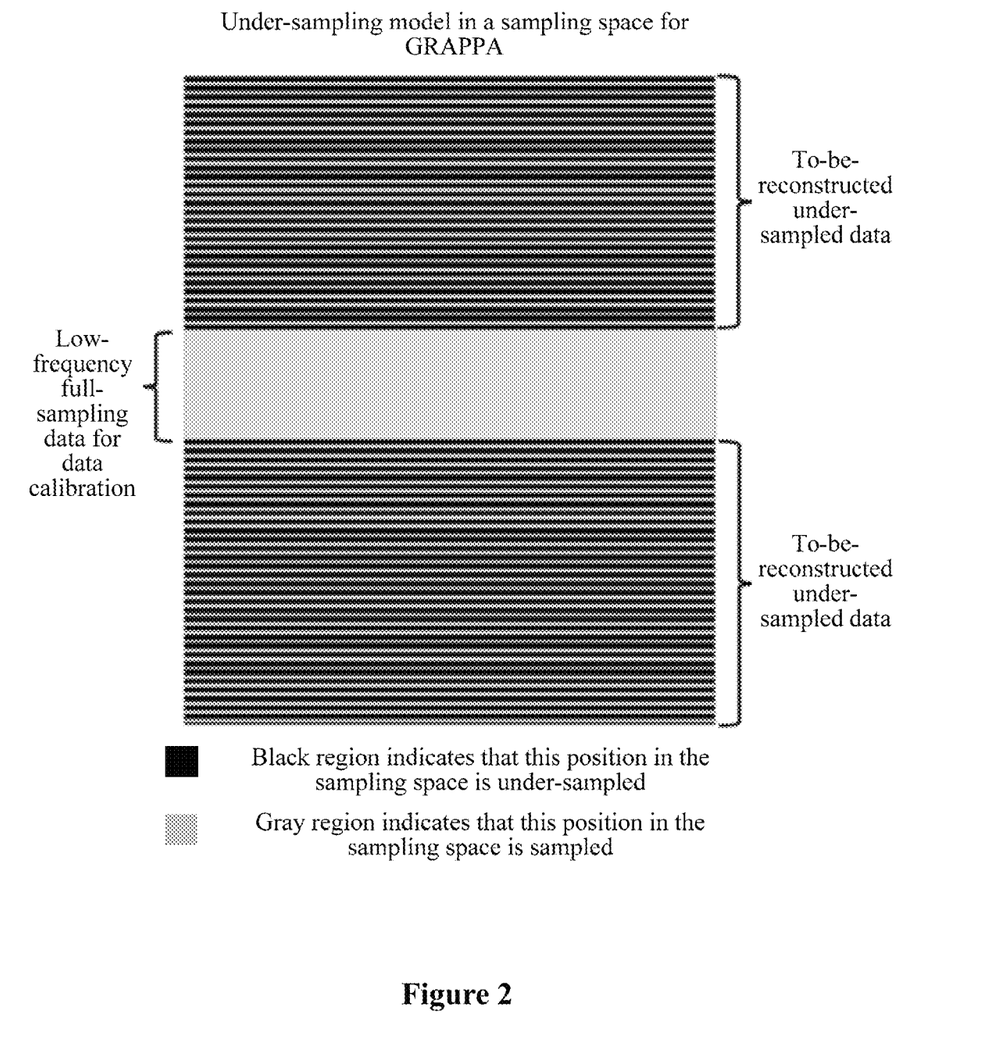
FIG. 2 shows an under-sampling scheme in which a VCC-NL-GRAPPA method performs reduction in a sampling space.

Reference is made to FIG. 2, which shows an undersampling scheme in which a VCC-NL-GRAPPA (nonlinear generalized auto calibrating partially parallel acquisitions based on virtual coil conception) method performs reduction in a sampling space. In a quadrate sampling space, a black region indicates an under-sampled region and a gray region indicates a sampled region.

Further, it should be noted that, in some cases, margins of the full-sampling data in the low-frequency region also include parts of high-frequency data.

In a preferred embodiment, in step S6, the complete sampling space data for each channel is squared to obtain a square of the complete sampling space data for each channel and the squares of the complete sampling space data for the multiple channels are summed to obtain the final reconstructed image, or the complete sampling space data for the multiple channels are multiplied by sensitivities of the coils for the multiple channels to obtain products respectively and the products are summed to obtain the final reconstructed image.

In a preferred embodiment, in step S2, the data combination term includes a constant, a linear data term, and a nonlinear data term.

An exponent of the nonlinear data term in the present disclosure may be two, three or more, or may be a combination of at least two of the above exponents.

In a preferred embodiment, in step S3, a mixed data combination term is generated by using the data combination term and the full-sampling data in the low-frequency region of the sampling space. The mixed data combination term includes a constant, a linear data term, and a nonlinear data term.

In a preferred embodiment, the nonlinear data term in the data combination term is a nonlinear data term which is raised to the power of two or more; and/or the nonlinear data term in the mixed data combination term is a nonlinear data term which is raised to the power of two or more.

Actual multi-channel coil data and virtual multi-channel coil data are combined to obtain the constant, the linear data term and the nonlinear data term. Since there are a large number of linear data terms, nonlinear data combination terms which are raised to the power of two are generally selected, to accelerate computing speed without greatly reducing final imaging quality. Data combination terms which are raised to the power of three or more are omitted in implementation.

In a preferred embodiment, in the calibrating in step S3, fitting is performed by using a linear regression method to obtain a set of weighting factors and constructing a set of linear combination relationships between data and adjacent data of the data in the sampling space.

In order to reconstruct missing data which is not sampled in the high-frequency region of the sampling space, parts of full-sampling data in the low-frequency region of the sampling space are firstly used to perform the calibrating, that is, a set of weighting factors are obtained by a linear regression method and then a set of linear combination relationships between data and its adjacent data in the sampling space are constructed.

In a preferred embodiment, the calibrating in step S3 is performed by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \bar{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \bar{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\bar{S}_l(k_y + b \cdot R \cdot \Delta k_y, k_x + h \cdot \Delta k_x) \times \bar{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \bar{S}_l(k_y + b \cdot R \cdot \Delta k_y, k_x + h \cdot \Delta k_x) \times$$

$$\bar{S}_l(k_y + b \cdot R \cdot \Delta k_y, k_x + (h+2) \cdot \Delta k_x)$$

where $j = 1, 2, \ldots, 2 \cdot L$, $r \neq b \cdot R$, and

-continued $$\tilde{S}_l(k) = \begin{cases} S_l(k), & l = 1, 2, \ldots \ldots L \\ S_l^*(-k), & l = L+1, L+2, \ldots \ldots 2 \cdot L \end{cases},$$

k denotes any position in a K space, l denotes an ordinal number of a channel, b denotes a distance between to-be-estimated data and actual sampling data in an under-sampling phase encoding gradient direction in a sampling space, h denotes a distance between the to-be-estimated data and the actual sampling data in a full-sampling frequency encoding gradient direction in the sampling space, $S_l$ denotes sampling space data of an l-th channel, $S_l^*$ denotes a conjugate transposition matrix of $S_l$, $k_x$, $k_y$ denote coordinate values of a sampling data point in a two-dimensional sampling space, $\Delta k_x$, $\Delta k_y$ denote a minimum distance between adjacent sampling points when the full-sampling is performed in the sampling space, R denotes the number of times of reduction, i.e., the number of times of under-sampling, $\tilde{w}_{j,r}^{(2,1)}(l, b, h)$ denotes a weighting factor in a GRAPPA imaging method and may be obtained by calibrating full-sampling data in a low-frequency region of the sampling space, where j denotes an ordinal number of a channel, r denotes an ordinal number of a channel displacement, a first number in a superscript (2, 1) denotes an exponent and a second number in the superscript (2, 1) denotes a lateral distance, that is, $\tilde{w}_{j,r}^{(2,1)}(l, b, h)$ is a dot product of $\tilde{w}_{j,r}^{(2)}(l, b, h)$ and a weighting factor a lateral distance from which to $\tilde{w}_{j,r}^{(2)}(l, b, h)$ is one.

$B_1$, $B_2$, $H_1$, $H_2$ denote the numbers of weighting factors in the imaging method.

A computer readable medium is provided according to the present disclosure. The computer readable medium stores a program. The program is executed by a computer to perform the imaging method.

A device for magnetic resonance image reconstruction implementing the imaging method is provided according to the disclosure. The device includes an acquiring module, a data combining module, a calibrating module, a reconstructing data module, a fusing module and an imaging module.

The acquiring module is configured to: acquire, in a parallel manner, actual coil data by using coils for multiple channels; and expand the actual coil data to obtain virtual coil data having the same number of channels as the actual coil data. The virtual coil data and the actual coil data have a conjugate symmetric relationship.

The data combining module is configured to combine the actual coil data and the virtual coil data to obtain a data combination term.

The calibrating module is configured to calibrate a weighting factor by using the data combination term and full-sampling data in a low-frequency region of a sampling space.

The reconstructing data module is configured to reconstruct missing data in the sampling space based on the calibrated weighting factor to obtain reconstructed data. The missing data indicates data which is not sampled in a high-frequency region of the sampling space.

The fusing module is configured to fuse the full-sampling data in the low-frequency region of the sampling space and the reconstructed data to obtain complete sampling space data.

The imaging module is configured to obtain a final reconstructed image based on the complete sampling space data for multiple channels.

In a preferred embodiment, the imaging module is configured to: square the complete sampling space data for each channel to obtain a square of the complete sampling space data for each channel and sum the squares of the complete sampling space data for the multiple channels to obtain the final reconstructed image; or multiply the complete sampling space data for the multiple channels by sensitivities of the coils for the multiple channels to obtain products respectively and sum the products to obtain the final reconstructed image.

In a preferred embodiment, the data combination term obtained by the data combining module includes a constant, a linear data term, and a nonlinear data term. The calibrating module is configured to generate a mixed data combination term by using the data combination term and the full-sampling data in the low-frequency region of the sampling space. The mixed data combination term includes a constant, a linear data term, and a nonlinear data term.

In a preferred embodiment, the nonlinear data term in the data combination term obtained by the calibrating module is a nonlinear data term which is raised to the power of two or more; and/or the nonlinear data term in the mixed data combination term is a nonlinear data term which is raised to the power of two or more. The calibrating module is configured to perform fitting by using a linear regression method to obtain a set of weighting factors and construct a set of linear combination relationships between data and adjacent data of the data in the sampling space.

In a preferred embodiment, the calibrating module is configured to perform the calibrating by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \tilde{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \tilde{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\tilde{S}_l(k_y + b \cdot R \cdot \Delta k_y, k_x + h \cdot \Delta k_x) \times \tilde{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \tilde{S}_l(k_y + b \cdot R \cdot \Delta k_y, k_x + h \cdot \Delta k_x) \times$$

$$\tilde{S}_l(k_y + b \cdot R \cdot \Delta k_y, k_x + (h+2) \cdot \Delta k_x)$$

where $j = 1, 2, \ldots, 2 \cdot L$, $r \neq b \cdot R$, and $$\tilde{S}_l(k) = \begin{cases} S_l(k), & l = 1, 2, \ldots \ldots L \\ S_l^*(-k), & l = L+1, L+2, \ldots \ldots 2 \cdot L \end{cases}.$$

k denotes any position in a K space, l denotes an ordinal number of a channel, b denotes a distance between to-be-estimated data and actual sampling data in an under-sampling phase encoding gradient direction in a sampling space, h denotes a distance between the to-be-estimated data and the actual sampling data in a full-sampling frequency encoding gradient direction in the sampling space, $S_l$ denotes sampling space data of an l-th channel, $S_l^*$ denotes a conjugate transposition matrix of $S_l$, $k_x$, $k_y$ denote coordinate values of a sampling data point in a two-dimensional sampling space, $\Delta k_x$, $\Delta k_y$ denote a minimum distance between adjacent sampling points when the full-sampling is performed in the sampling space, R denotes the number of times of reduction, i.e., the number of times of under-sampling, $\tilde{w}_{j,r}^{(2,1)}(l, b, h)$ denotes a weighting factor in a GRAPPA imaging method and may be obtained by calibrating full-sampling data in a low-frequency region of the sampling space, where j denotes an ordinal number of a channel, r denotes an ordinal number of a channel displacement, a first number in a superscript (2, 1) denotes an exponent and a second number in the superscript (2, 1) denotes a lateral distance, that is $\tilde{w}_{j,r}^{(2,1)}(l, b, h)$ is a dot product of $\tilde{w}_{j,r}^{(2)}(l, b, h)$ and a weighting factor a lateral distance from which to $\tilde{w}_{j,r}^{(2)}(l, b, h)$ is one. $B_1$, $B_2$, $H_1$, $H_2$ denote the numbers of weighting factors in the imaging method.

Figure 3:
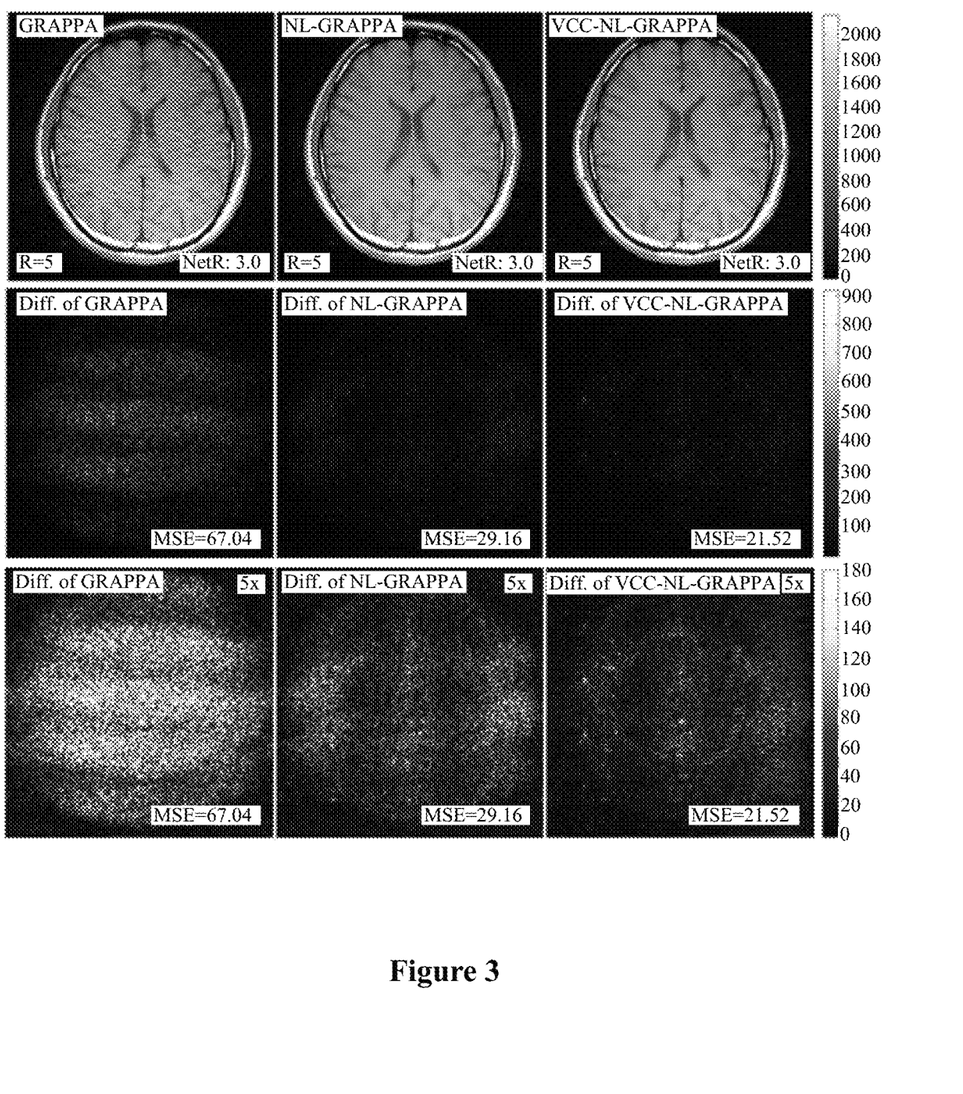
FIG. 3 shows reconstructed images in a GRAPPA method, an NL-GRAPPA method and a VCC-NL-GRAPPA method at five-times reduction (three-times net reduction)
Figure 4:
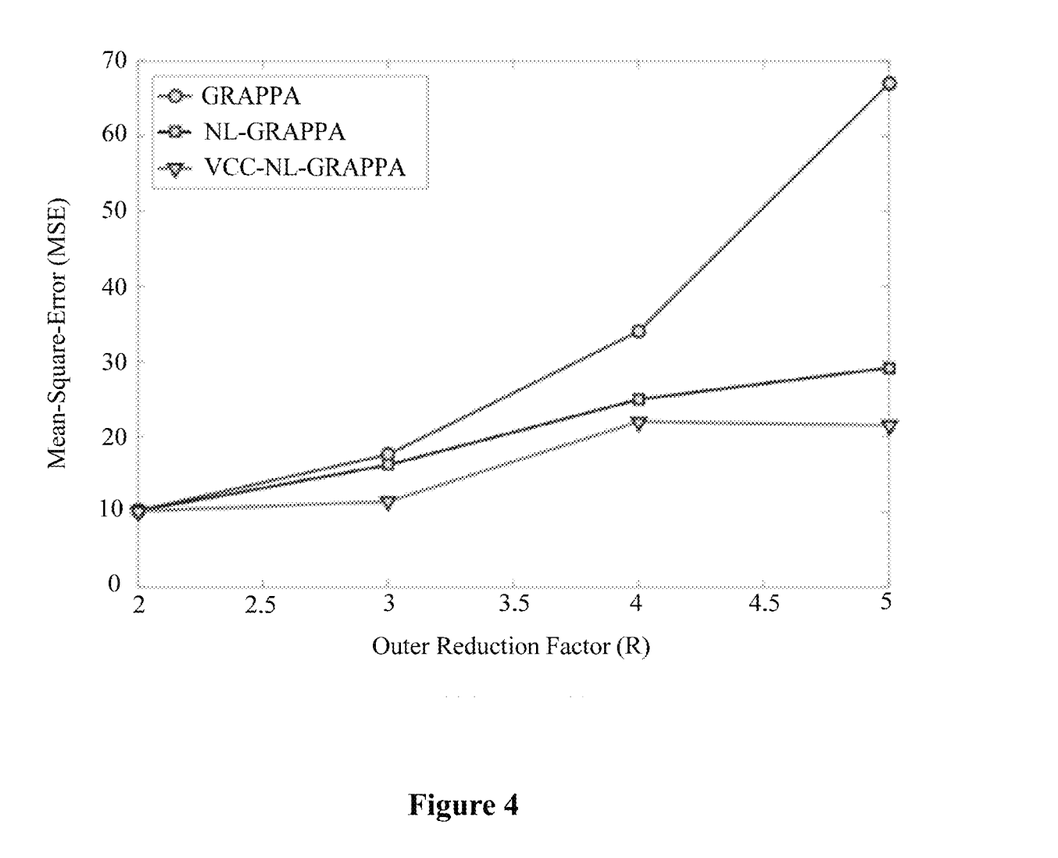
FIG. 4 shows a relationship of a mean-square-error and an outer reduction factor in a GRAPPA method, an NL-GRAPPA method, and a VCC-NL-GRAPPA method.

With the imaging method disclosed in the present disclosure, results obtained through simulation and experiments are shown in FIGS. 3 and 4. FIG. 3 shows reconstructed images in a generalized auto calibrating partially parallel acquisitions (GRAPPA) method, a nonlinear GRAPPA (NL-GRAPPA) method and a nonlinear GRAPPA based on virtual coil conception (VCC-NL-GRAPPA) method at five-times reduction (three-times net reduction). FIG. 4 shows a relationship of a mean-square-error and an outer reduction factor in a GRAPPA method, an NL-GRAPPA method, and a VCC-NL-GRAPPA method. Diff. denotes a difference between a reconstructed image and a reference image. ×5 denotes that the difference is displayed with being magnified for 5 times. MES denotes the mean-square-error. R denotes the outer reduction factor. NetR denotes a net reduction factor.

As shown in Figures, the MES, artifacts, and noise of the reconstructed image obtained by the imaging method in the present disclosure are reduced compared with that in the reconstructed images obtained by the GRAPPA method and the Nonlinear GRAPPA method.

Finally, it should be noted that the embodiments above described are typical and preferred embodiments of the present disclosure, which are used to only describe and explain the technical solutions of the present disclosure, so as to facilitate understanding of readers and are not intended to limit the protective scope or application of the present disclosure. Therefore, technical resolutions obtained from any modifications, equivalent replacements, improvements or the like that are made within the spirit and principle of the present disclosure should be included in the protective scope of the present disclosure.

The invention claimed is:

1. An imaging method for nonlinear parallel magnetic resonance image reconstruction, the imaging method being performed by a processor of a device for magnetic resonance image reconstruction, the method comprising the steps of:
   a., acquiring, in a parallel manner, actual coil data by using coils for a plurality of channels and expanding the actual coil data to obtain virtual coil data having the same number of channels as the actual coil data, wherein the virtual coil data and the actual coil data have a conjugate symmetric relationship;
   b., combining the actual coil data and the virtual coil data to obtain a data combination term;
   c., calibrating a weighting factor by using the data combination term and full-sampling data in a low-frequency region of a sampling space;
   d., reconstructing missing data in the sampling space based on the calibrated weighting factor to obtain reconstructed data, wherein the missing data indicates data which is not sampled in a high-frequency region of the sampling space;
   e., fusing the full-sampling data in the low-frequency region of the sampling space and the reconstructed data to obtain complete sampling space data; and
   f., obtaining a final reconstructed image based on the complete sampling space data for the plurality of channels, wherein the final reconstructed image is sent to a display device for display, to implement magnetic resonance image reconstruction,
   wherein in b., the data combination term comprises a constant, a linear data term, and a nonlinear data term.

2. A non-transitory computer readable medium storing a program, wherein the program is executed by a computer to perform an imaging method comprising:
   a., acquiring, in a parallel manner, actual coil data by using coils for a plurality of channels and expanding the actual coil data to obtain virtual coil data having the same number of channels as the actual coil data, wherein the virtual coil data and the actual coil data have a conjugate symmetric relationship;
   b., combining the actual coil data and the virtual coil data to obtain a data combination term;
   c., calibrating a weighting factor by using the data combination term and full-sampling data in a low-frequency region of a sampling space;
   d., reconstructing missing data in the sampling space based on the calibrated weighting factor to obtain reconstructed data, wherein the missing data indicates data which is not sampled in a high-frequency region of the sampling space;
   e., fusing the full-sampling data in the low-frequency region of the sampling space and the reconstructed data to obtain complete sampling space data; and
   f., obtaining a final reconstructed image based on the complete sampling space data for the plurality of channels, wherein the final reconstructed image is sent to a display device for display, to implement magnetic resonance image reconstruction,
   wherein in b., the data combination term comprises a constant, a linear data term, and a nonlinear data term.

3. A device for magnetic resonance image reconstruction, the device comprising a processor and a memory for storing program instructions, wherein the processor is configured to execute the program instructions to:
   acquire, in a parallel manner, actual coil data by using coils for a plurality of channels and expand the actual coil data to obtain virtual coil data having the same number of channels as the actual coil data, wherein the virtual coil data and the actual coil data have a conjugate symmetric relationship;
   combine the actual coil data and the virtual coil data to obtain a data combination term;
   calibrate a weighting factor by using the data combination term and full-sampling data in a low-frequency region of a sampling space;
   reconstruct missing data in the sampling space based on the calibrated weighting factor to obtain reconstructed data, wherein the missing data indicates data which is not sampled in a high-frequency region of the sampling space;

fuse the full-sampling data in the low-frequency region of the sampling space and the reconstructed data to obtain complete sampling space data; and obtain a final reconstructed image based on the complete sampling space data for the plurality of channels, wherein the final reconstructed image is sent to a display device for display, to implement magnetic resonance image reconstruction, wherein the data combination term comprises a constant, a linear data term, and a nonlinear data term, and the processor is further configured to execute the program instructions to generate a mixed data combination term by using the data combination term and the full-sampling data in the low-frequency region of the sampling space, wherein the mixed data combination term comprises a constant, a linear data term, and a nonlinear data term.

4. The imaging method according to claim 1, wherein f. comprises:

squaring the complete sampling space data for each channel to obtain a square of the complete sampling space data for each channel and summing the squares of the complete sampling space data for the plurality of channels to obtain the final reconstructed image; or multiplying the complete sampling space data for the plurality of channels by sensitivities of the coils for the plurality of channels to obtain products respectively and summing the products to obtain the final reconstructed image.

5. The imaging method according to claim 1, wherein c. comprises:

generating a mixed data combination term by using the data combination term and the full-sampling data in the low-frequency region of the sampling space, wherein the mixed data combination term comprises a constant, a linear data term, and a nonlinear data term.

6. The imaging method according to claim 5, wherein the nonlinear data term in the data combination term is a nonlinear data term which is raised to the power of two or more;

and/or the nonlinear data term in the mixed data combination term is a nonlinear data term which is raised to the power of two or more.

7. The imaging method according to claim 6, wherein the calibrating in c. comprises:

performing fitting by using a linear regression method to obtain a set of weighting factors and constructing a set of linear combination relationships between data and adjacent data of the data in the sampling space.

8. The imaging method according to claim 7, wherein the calibrating in c. is performed by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \bar{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \bar{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\bar{S}_l(k_y + b \cdot R \cdot \Delta k_y, k_x + h \cdot \Delta k_x) \times \bar{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \bar{S}_l(k_y + b \cdot R \cdot \Delta k_y, k_x + h \cdot \Delta k_x) \times$$

$$\bar{S}_l(k_y + b \cdot R \cdot \Delta k_y, k_x + (h+2) \cdot \Delta k_x)$$

wherein $j = 1, 2, \ldots, 2 \cdot L$, $r \neq b \cdot R$, and $$\bar{S}_l(k) = \begin{cases} S_l(k), & l = 1, 2, \ldots \ldots L \\ S_l^*(-k), & l = L+1, L+2, \ldots \ldots 2 \cdot L. \end{cases}$$

9. The device according to claim 3, wherein the processor is further configured to execute the program instructions to:

square the complete sampling space data for each channel to obtain a square of the complete sampling space data for each channel and sum the squares of the complete sampling space data for the plurality of channels to obtain the final reconstructed image; or multiply the complete sampling space data for the plurality of channels by sensitivities of the coils for the plurality of channels to obtain products respectively and sum the products to obtain the final reconstructed image.

10. The device according to claim 3, wherein the nonlinear data term in the data combination term is a nonlinear data term which is raised to the power of two or more; and/or the nonlinear data term in the mixed data combination term is a nonlinear data term which is raised to the power of two or more;

the processor is further configured to execute the program instructions to perform fitting by using a linear regression method to obtain a set of weighting factors and construct a set of linear combination relationships between data and adjacent data of the data in the sampling space.

11. The device according to claim 3, wherein the processor is further configured to execute the program instructions to perform the calibrating by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \bar{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \bar{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\bar{S}_l(k_y + b \cdot R \cdot \Delta k_y, k_x + h \cdot \Delta k_x) \times \bar{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \bar{S}_l(k_y + b \cdot R \cdot \Delta k_y, k_x + h \cdot \Delta k_x) \times$$

$$\bar{S}_l(k_y + b \cdot R \cdot \Delta k_y, k_x + (h+2) \cdot \Delta k_x)$$

wherein $j = 1, 2, \ldots, 2 \cdot L$, $r \neq b \cdot R$, and $$\bar{S}_l(k) = \begin{cases} S_l(k), & l = 1, 2, \ldots \ldots L \\ S_l^*(-k), & l = L+1, L+2, \ldots \ldots 2 \cdot L. \end{cases}$$

12. The non-transitory computer readable medium according to claim 2, wherein step S6 comprises:
   squaring the complete sampling space data for each channel to obtain a square of the complete sampling space data for each channel and summing the squares of the complete sampling space data for the plurality of channels to obtain the final reconstructed image; or
   multiplying the complete sampling space data for the plurality of channels by sensitivities of the coils for the plurality of channels to obtain products respectively and summing the products to obtain the final reconstructed image.

13. The non-transitory computer readable medium according to claim 2, wherein step S3 comprises:
   generating a mixed data combination term by using the data combination term and the full-sampling data in the low-frequency region of the sampling space, wherein the mixed data combination term comprises a constant, a linear data term, and a nonlinear data term.

14. The non-transitory computer readable medium according to claim 13, wherein the nonlinear data term in the data combination term is a nonlinear data term which is raised to the power of two or more; and/or the nonlinear data term in the mixed data combination term is a nonlinear data term which is raised to the power of two or more.

15. The non-transitory computer readable medium according to claim 14, wherein the calibrating in c. comprises:
   performing fitting by using a linear regression method to obtain a set of weighting factors and constructing a set of linear combination relationships between data and adjacent data of the data in the sampling space.

16. The non-transitory computer readable medium according to claim 15, wherein the calibrating in c. is performed by using the following formula:

$$S_j(k_y + r \cdot \Delta k_y, k_x) =$$

$$\sum_{l=1}^{2L} \sum_{b=B_1}^{B_2} \sum_{h=H_1}^{H_2} \tilde{w}_{j,r}^{(1)}(l, b, h) \times \overline{S}_l(k_y + b \cdot R \cdot \Delta k_y, k_x + h \cdot \Delta k_x) + \tilde{w}_{j,r}^{(0)} \times 1$$

$$+ \sum_{l=1}^{L} \sum_{b=B_1}^{B_2} \sum_{h=H_1}^{H_2} \tilde{w}_{j,r}^{(2,0)}(l, b, h) \times \tilde{S}_l^2(k_y + b \cdot R \cdot \Delta k_y, k_x + h \cdot \Delta k_x) +$$

$$\sum_{l=1}^{L} \sum_{b=B_1}^{B_2} \sum_{h=H_1}^{H_2-1} \tilde{w}_{j,r}^{(2,1)}(l, b, h) \times$$

$$\tilde{S}_l(k_y + b \cdot R \cdot \Delta k_y, k_x + h \cdot \Delta k_x) \times \tilde{S}_l(k_y + b \cdot R \cdot \Delta k_y, k_x + (h+1) \cdot \Delta k_x) +$$

$$\sum_{l=1}^{L} \sum_{b=B_1}^{B_2} \sum_{h=H_1}^{H_2-1} \tilde{w}_{j,r}^{(2,2)}(l, b, h) \times \tilde{S}_l(k_y + b \cdot R \cdot \Delta k_y, k_x + h \cdot \Delta k_x) \times$$

$$\tilde{S}_l(k_y + b \cdot R \cdot \Delta k_y, k_x + (h+2) \cdot \Delta k_x)$$

wherein $j = 1, 2, \ldots, 2 \cdot L$, $r \neq b \cdot R$, and $$\tilde{S}_l(k) = \begin{cases} S_l(k), & l = 1, 2, \ldots \ldots L \\ S_l^*(-k), & l = L+1, L+2, \ldots \ldots 2 \cdot L. \end{cases}$$

* * * * *